(12) United States Patent
Kamimura et al.

(10) Patent No.: US 8,715,524 B2
(45) Date of Patent: May 6, 2014

(54) POLISHING LIQUID

(75) Inventors: Tetsuya Kamimura, Haibara-gun (JP); Toshiyuki Saie, Haibara-gun (JP); Masaru Yoshikawa, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 829 days.

(21) Appl. No.: 12/036,686

(22) Filed: Feb. 25, 2008

(65) Prior Publication Data

US 2008/0203354 A1 Aug. 28, 2008

(30) Foreign Application Priority Data

Feb. 26, 2007 (JP) .................................. 2007-046207

(51) Int. Cl.
*C09K 13/00* (2006.01)
*H01L 21/302* (2006.01)

(52) U.S. Cl.
USPC ....... 252/79.1; 252/79.2; 252/79.3; 252/79.4; 252/79.5; 438/689; 438/690; 438/691; 438/692

(58) Field of Classification Search
USPC ........ 438/692, 689, 690, 691; 252/79.1, 79.3, 252/79.4
See application file for complete search history.

(56) References Cited

U.S. PATENT DOCUMENTS

| | | |
|---|---|---|
| 3,551,168 A | 12/1970 | Atherton et al. |
| 2002/0017630 A1 | 2/2002 | Uchida et al. |
| 2003/0041526 A1 * | 3/2003 | Fujii et al. ............. 51/307 |
| 2004/0115107 A1 * | 6/2004 | Singh ...................... 423/22 |
| 2005/0031789 A1 * | 2/2005 | Liu et al. ................ 427/340 |
| 2005/0076580 A1 | 4/2005 | Tamboli et al. |
| 2005/0191823 A1 | 9/2005 | Horikawa et al. |
| 2006/0110923 A1 | 5/2006 | Liu et al. |
| 2006/0226122 A1 * | 10/2006 | Wojtczak et al. ........ 216/83 |
| 2008/0161217 A1 * | 7/2008 | Zhang et al. ........... 510/176 |
| 2009/0130849 A1 * | 5/2009 | Lee ....................... 438/693 |

FOREIGN PATENT DOCUMENTS

| | | |
|---|---|---|
| JP | 2000-84832 A | 3/2000 |
| JP | 2003-17446 A | 1/2003 |
| JP | 2003-142435 A | 5/2003 |
| JP | 2004-285276 A | 10/2004 |
| JP | 2005-101545 A | 4/2005 |
| JP | 2005-117046 A | 4/2005 |
| JP | 2005-244123 A | 9/2005 |
| JP | 2006-148136 A | 6/2006 |

OTHER PUBLICATIONS

Japanese Office Action for Application No. 2008-034776 mail date Nov. 20, 2012.

* cited by examiner

*Primary Examiner* — Nadine Norton
*Assistant Examiner* — Christopher Remavege
(74) *Attorney, Agent, or Firm* — Sughrue Mion, PLLC

(57) ABSTRACT

The invention provides a polishing liquid for polishing a barrier layer of a semiconductor integrated circuit, the polishing liquid comprising: a diquaternary ammonium cation; a corrosion inhibiting agent; and a colloidal silica, wherein the pH of the polishing liquid is in the range of 2.5 to 5.0. According to the invention, a polishing liquid capable of achieving a superior barrier layer polishing rate, as well as suppressing the occurrence of scratching due to the agglomeration of solid abrasive grains can be provided.

19 Claims, No Drawings

POLISHING LIQUID

CROSS-REFERENCE TO RELATED APPLICATION

This application claims priority under 35 USC 119 from Japanese Patent Application No. 2007-046207, the disclosure of which is incorporated by reference herein.

BACKGROUND OF THE INVENTION

1. Field of the Invention

The present invention relates to a polishing liquid employed in a manufacturing process for a semi-conductor device. More specifically, it relates to a polishing liquid which is preferably employed to polish a barrier layer consisting mainly of a barrier metallic material, for planarizing during a process for forming wiring lines on a semi-conductor device.

2. Related Art

In recent years, in the development of semi-conductor devices such as semi-conductor integrated circuits (hereinafter, referred to as "LSI"), increased density and integration have been sought by reducing the thickness of wiring lines and creating multiple layers thereof in order to miniaturize and increase the speeds of such devices. Moreover, various types of technologies, such as chemical mechanical polishing (hereinafter, referred to as "CMP"), and the like, have been employed in order to achieve this objective. CMP is an essential technology for surface planarization of processed layers, such as interlayer insulation films, for plug formation, for formation of embedded metal wiring lines, and the like, and CMP performs smoothing of a substrate and eliminates excessive metallic thin films from wiring line formation, and eliminates excessive barrier layer on the surface of insulating films.

A conventional method of CMP is one in which a polishing pad is fixed to the surface of a circular polishing table (polishing platen), the surface of the polishing pad is impregnated with a polishing liquid, the surface of the substrate (wafer) is pressed onto the pad, and both the polishing platen and the wafer are rotated while a predetermined amount of pressure (polishing pressure) is applied from the backsides thereof, such that the surface of the wafer is thereby planarized via the mechanical abrasion produced therefrom.

When semi-conductor devices such as LSIs are produced, fine lines are formed in multiple wiring layers, and a barrier metal such as of Ta, TaN, Ti and TiN is pre-formed in order to prevent diffusion of the wiring material into interlayer insulation film(s), and in order to improve adhesion of the wiring line material, when forming the metal wiring lines, such as of copper, in each of these layers.

In order to form each wiring layer, in general, a CMP process on metallic film (hereinafter, referred to as "metallic film CMP") is first performed at a single stage or at multiple stages to remove excess wiring material that has been deposited by plating or the like, and thereafter, a CMP process is carried out to remove barrier metal material (barrier metal) that has been exposed on the surface of the metallic film (hereinafter, referred to as "barrier metal CMP"). However, metallic film CMP can cause over-polishing, referred to as dishing, and occurrence of erosion of the wiring lines portions.

In order to reduce such dishing, in such barrier metal CMP, which follows the metallic film CMP, a wiring layer should be formed in which level differences due to dishing, erosion, and the like are ultimately reduced by regulating the polishing rate of the metal wiring portion and the polishing rate of the barrier metal portion. Specifically, in barrier metal CMP, it is preferable that the polishing rates of the barrier metal and insulation layer are moderately high, since dishing due to over-polishing of the wiring portion and erosion resulting from dishing may occur when the polishing rates of the barrier metal and the interlayer insulation film are relatively low when compared with to the polishing rate of the metal wiring material. Not only does this have the advantage of improving the barrier metal CMP throughput, but there is a requirement to relatively increase the polishing rates of the barrier metal and the insulation layer for the above reasons, since dishing is often caused by metallic film CMP in practice.

A metal polishing liquid employed in CMP generally includes abrasive grains (for example, aluminum oxide or silica) and an oxidizing agent (for example, hydrogen peroxide or persulfuric acid). The basic polishing mechanism is thought to be that the metal surface is oxidized with the oxidizing agent, and then the oxide film formed thereby is removed with the abrasive grains.

However, when a polishing liquid including these sorts of solid abrasive grains is used in a CMP process, problems such as polishing damage (scratching), a phenomenon in which the entire polishing surface is over-polished (thinning), a phenomenon in which the polished metallic surface is dished (dishing), and a phenomenon in which plural metallic wiring surfaces are dished due to over-polishing of the insulator placed between the metallic wiring layers (erosion), and the like, may occur.

Moreover, there are cost-related problems, such as a conventionally employed cleaning process for eliminating residual polishing liquid from a semi-conductor surface after polishing with a polishing liquid containing solid abrasive grains can be complicated, and such as the requirement that solid abrasive grains must be precipitated when disposing of liquid after such cleaning (waste liquid).

The following investigations have been conducted with regard to a polishing liquid containing this type of solid abrasive grains.

For example, a CMP polishing agent and a polishing method that aim to achieve a high polishing rate, with virtually no occurrence of scratching is proposed (for example, Japanese Patent Application Laid-Open No. 2003-17446), a polishing composition and a polishing method for improving washability in CMP is proposed (for example, Japanese Patent Application Laid-Open No. 2003-142435), and a polishing composition that aims to prevent agglomeration of abrasive grains is proposed (for example, Japanese Patent Application Laid-Open No. 2000-84832).

However, even in the abovementioned polishing liquids, there is still no technology for achieving a high polishing rate when polishing a barrier layer, while inhibiting scratching caused by the agglomeration of solid abrasive grains.

SUMMARY OF THE INVENTION

The present invention has been made in view of the above circumstances and provides a polishing liquid.

According to an aspect of the invention, there is provided a polishing liquid for polishing a barrier layer of a semiconductor integrated circuit, the polishing liquid comprising:

a diquaternary ammonium cation;

a corrosion inhibiting agent; and a colloidal silica, wherein the pH of the polishing liquid is in the range of 2.5 to 5.0.

DETAILED DESCRIPTION OF THE INVENTION

Hereinafter, the specific embodiments of the present invention will be explained.

The polishing liquid of the present invention is the polishing liquid for polishing a barrier layer of an integrated circuit of a semi-conductor including: (A) a diquaternary ammonium cation, (B) a corrosion inhibiting agent, and (C) colloidial silica, and having a pH in the range of 2.5 to 5.0, as well as an optional component, when necessary.

Each component of the polishing liquid of the present invention may include a single component or a combination of two or more types.

Although the effects of the present invention are not clear, they are hypothesized in the following manner.

Specifically, it is thought that the interaction between a polishing particulate and a surface to be polished is strengthened by the diquaternary ammonium cation in the polishing liquid being adsorbed to a surface of the polishing particulate. More specifically, it is thought that repulsive force between the polishing particulate having the surface negatively charged and the surface to be polished having the surface negatively charged is alleviated by the action of the diquaternary ammonium cation. As a result, it is thought that a physical action between the polishing particulate and the surface to be polished (a physical action of elimination by scratching) is strengthened, and a polishing rate in each type of film is thereby improved.

The "polishing liquid" of the present invention includes not only the polishing liquid at the time of using in polishing (specifically, the polishing liquid that is diluted as required), but also includes a concentrated liquid of the polishing liquid. A concentrated liquid or a concentrated polishing liquid refers to a polishing liquid in which the concentration of a solute is regulated to a higher level than that of the polishing liquid when used in polishing, and is used by diluting with water or an aqueous solution at the time of polishing. The dilution rate is typically 1 to 20 times in volume. The expressions "concentrate" and "concentrated liquid" in the present specification are used as the expressions that are conventionally used to stand for "condensate" or "condensed liquid", i.e., a more concentrated state than the state when employed, rather than the meanings of general terminology accompanying a physical concentration process such as evaporation, and the like.

Hereinafter, each constituent component of the polishing liquid of the present invention will be explained in greater detail.

(A) Diquaternary Ammonium Cation:

The polishing liquid of the present invention includes a diquaternary ammonium cation (hereinafter, simply referred to as "specific cation").

The diquaternary ammonium cation of the present invention is not particularly limited as long as it has a configuration which includes two quaternary nitrogens within the molecular structure. Among these, from the perspective of achieving an adequate improvement in the polishing rate, the diquaternary ammonium cation is preferably the cation introduced from a compound represented by the formula (1) below:

Formula (1)

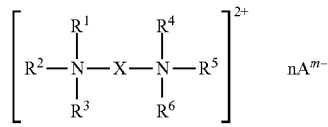

In the abovementioned formula (1), $R^1$ to $R^6$ each individually represent an alkyl group having 1 to 20 carbon atoms, an alkenyl group, a cycloalkyl group, an aryl group, or an aralkyl group. Moreover, pair(s) of the groups $R^1$ to $R^6$ of formula (1) may be bonded to each other.

Examples of the alkyl group having 1 to 20 carbon atoms may include, specifically, a methyl group, an ethyl group, a propyl group, a butyl group, a pentyl group, a hexyl group, a heptyl group, and an octyl group. Among these, the methyl group, ethyl group, propyl group, and butyl group are preferable.

Moreover, the alkenyl group preferably has 2 to 10 carbon atoms and examples thereof may include, specifically, an ethinyl group, a propyl group, and the like.

Examples of the cycloalkyl group may include, specifically, a cyclohexyl group, a cyclopentyl group, and the like. Among these, the cyclohexyl group is preferable.

Examples of the aryl group may include, specifically, a butynyl group, a pentynyl group, a hexynyl group, a phenyl group, a naphthyl group, and the like. Among these, the phenyl group is preferable.

Examples of the aralkyl group may include, specifically, a benzyl group and the like. Among these, the benzyl group is preferable.

Each of the abovementioned groups may also have a substituent group. Examples of the substituent group which can be incorporated may include a hydroxyl group, an amino group, a carboxyl group, a phosphoric group, an imino group, a thiol group, a sulfo group, a nitro group, and the like.

In the abovementioned formula (1), X represents an alkylene group having 1 to 10 carbon atoms, an alkenylene group, a cycloalkylene group, and an arylene group, or any combination of two or more groups thereof.

Moreover, in addition to the abovementioned organic linking groups, the linking group represented by X may also include a linking group such as —S—, —S(=O)$_2$—, —O—, and —C(=O)—, within a chain thereof.

Examples of the alkylene group having 1 to 10 carbon atoms may include, specifically, a methylene group, an ethylene group, a propylene group, a butylene group, a pentylene group, a hexylene group, a heptylene group, an octylene group, and the like. Out of these, the ethylene group and the pentylene group are preferable.

Examples of the alkenylene group may include, specifically, an ethenylene group, a propenylene group, and the like. Out of these, the propenylene group is preferred.

Examples of the cycloalkylene group may include, specifically, a cyclohexylene group, a cyclopentylene group, and the like. Out of these, the cyclohexylene group is preferred.

Examples of the arylene group may include, specifically, a phenylene group, and a naphthylene group. Out of these, the phenylene group is preferred.

Each of the abovementioned groups may further have a substituent group, and examples thereof may include a hydroxyl group, an amino group, a carboxyl group, a phosphoric group, an imino group, a thiol group, a sulfo group, a nitro group, and the like.

$nA^{m-}$ represents a counter anion, wherein n and m each independently represent an integer of 1 or 2. When n is 1, m is 2, and when n is 2, m is 1. Therefore, the counter anion represented by $nA^{m-}$ may be a monovalent ion or a divalent ion.

Specific examples of the counter anion represented by $nA^{m-}$ include a nitrate ion, a halide ion (such as a bromide ion, a chloride ion, a fluoride ion, and an iodide ion), a citrate ion, a phosphate ion, an oxalate ion, a phthalate ion, a maleate ion, a gluconate ion, a fumarate ion, a tartrate ion, a malate ion, a glycolate ion, a hydroxide ion, an acetate ion, a trifluoroacetate ion, a borate ion, a lactate ion, a thiocyanate ion, a cyanate ion, a sulfate ion, a silicate ion, a perhalide ion (such as a perbromide ion, a perchloride ion, and a periodide ion), a chromate ion, a p-toluenesulfonate ion, a benzenesulfonate ion, a methanesulfonate ion, a trifluoromethanesulfonate ion, an ethanesulfonate ion, a diglycolate ion, a 2,5-furandicarboxylate ion, a 2-tetrahydrofurancarboxylate ion, a borate ion, a tetrafluoroborate ion, and a hexafluorophosphate ion.

Among these, the counter anion represented by $nA^{m-}$ is preferably a nitrate ion, a citrate ion, a phosphate ion, an oxalate ion, a phthalate ion, a maleate ion, a fumarate ion, a tartrate ion, a malate ion, a glycolate ion, a hydroxide ion, an acetate ion, a trifluoroacetate ion, a lactate ion, a sulfate ion, a silicate ion, a p-toluenesulfonate ion, a benzenesulfonate ion, a methanesulfonate ion, a trifluoromethanesulfonate ion, an ethanesulfonate ion, a diglycolate ion, a 2,5-furandicarboxylate ion, a 2-tetrahydrofurancarboxylate ion, a borate ion, a tetrafluoroborate ion, and a hexafluorophosphate ion.

Hereinafter, specific examples (example cations (A-1) to (A-32)) of the (A) diquaternary ammonium cation (specific cation) of the present invention will be indicated. However, the present invention is not specifically limited to these examples.

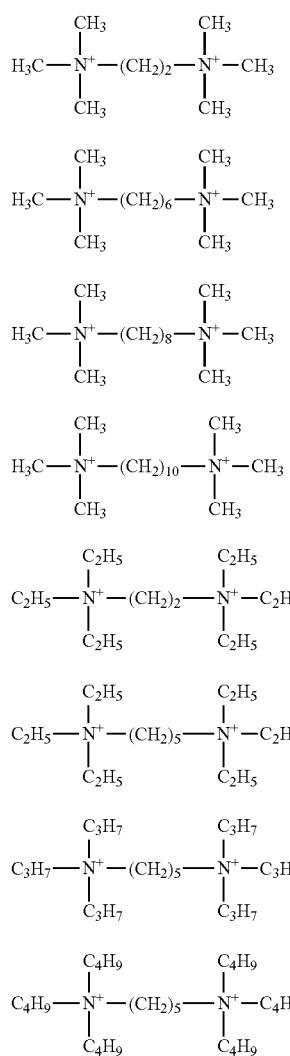

-continued

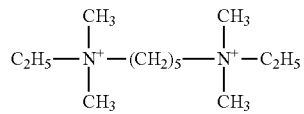

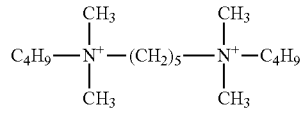

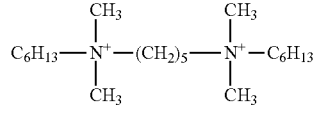

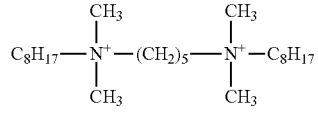

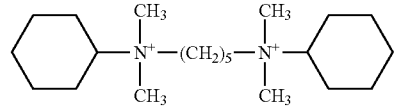

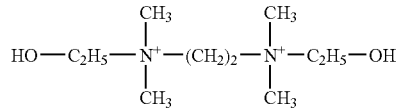

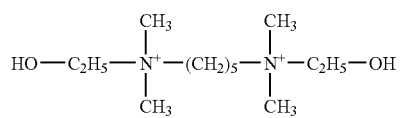

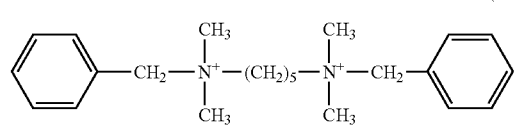

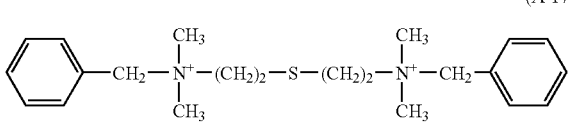

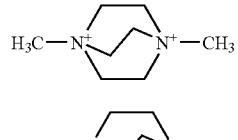

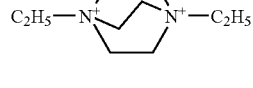

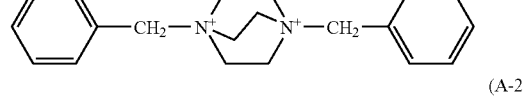

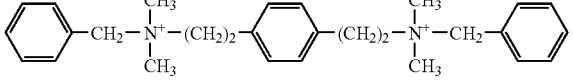

-continued

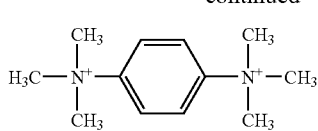
(A-22)

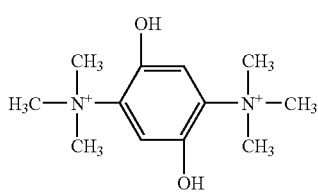
(A-23)

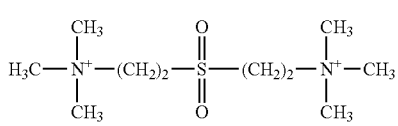
(A-24)

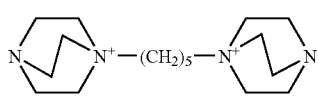
(A-25)

(A-26)

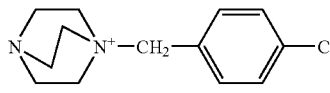
(A-27)

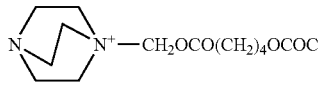
(A-28)

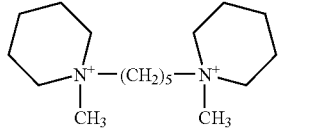
(A-29)

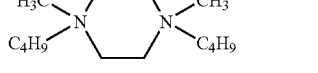
(A-30)

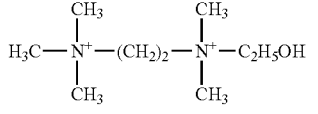
(A-31)

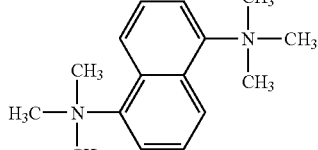
(A-32)

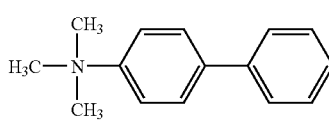

Considering the dispersion stability within the polishing liquid, among the abovementioned examples of the diquaternary ammonium cation (specific cation), (A-1), (A-2), (A-3), (A-4), (A-5), (A-6), (A-7), (A-8), (A-9), (A-10), (A-11), (A-12), (A-13), (A-14), (A-15), (A-18), (A-19), (A-22), (A-23), (A-29), (A-30), (A-31), and (A-32) are preferable.

The diquaternary ammonium cation (specific cation) of the present invention may be synthesized, for example, by a substitution reaction, in which the ammonia or various types of amines, and the like, works as a nucleophilic agent. The diquaternary ammonium cation may also be available as a commercial reagent.

The diquaternary ammonium cation (specific cation) of the present invention is generally introduced from a salt compound (preferably a compound represented by the above formula (1) into a polishing liquid.

The addition amount of the salt compound containing the specific cation with respect to the polishing liquid when used in polishing (specifically, if the polishing liquid is diluted by water or an aqueous solution, "the polishing liquid when used in polishing" refers to the polishing liquid after dilution. The same applies hereinafter) is preferably 0.00001 mass % to 1 mass %, and more preferably 0.0001 mass % to 0.5 mass %. Specifically, the amount of the salt compound containing the specific cation is preferably 0.00001 mass % or more from the perspective of sufficiently improving the polishing rate, and is preferably 1 mass % or less from the perspective of achieving sufficient stability of the slurry.

As mentioned above, by using the salt compound in preparing the polishing liquid, the polishing liquid includes counter anions of the corresponding number of moles to the number of moles of the specific cations.

(B) Corrosion Inhibiting Agent:

The polishing liquid of the present invention includes a corrosion inhibiting agent that inhibits corrosion of the metallic surface by adsorbing to the surface to be polished and forming a film thereon. The corrosion inhibiting agent of the present invention preferably contains a heteroaromatic ring compound containing at least three nitrogen atoms in the molecule and having a condensed ring structure. Here, the "at least three nitrogen atoms" are preferably atoms constituting the condensed ring, and the heteroaromatic compound is preferably benzotriazole or derivatives thereof obtained by incorporating a substituent group of various kinds into the benzotriazole.

Examples of the corrosion inhibiting agent that can be employed in the present invention may include benzotriazole, 1,2,3-benzotriazole, 5,6-dimethyl-1,2,3-benzotriazole, 1-(1,2-dicarboxyethyl)benzotriazole, 1-[N,N-bis(hydroxylethyl)aminomethyl]benzotriazole, and 1-(hydroxylmethyl)benzotriazole.

Out of these, 1,2,3-benzotriazole, 5,6-methyl-1,2,3-benzotriazole, 1-(1,2-dicarboxyethyl)benzotriazole, 1-[N,N-bis(hydroxylethyl)aminomethyl]benzotriazole, and 1-(hydroxylmethyl)benzotriazole are more preferably selected.

The addition amount of the (B) corrosion inhibiting agent with respect to the amount of polishing liquid when used in polishing is preferably no less than 0.01 mass % to no more than 0.2 mass %, and more preferably no less than 0.05 mass % to no more than 0.2 mass %. Specifically, the addition amount of the corrosion inhibiting agent is preferably no less than 0.01 mass % from the perspective of preventing expansion of dishing, and is preferably no more than 0.2 mass % from the perspective of storage stability.

(C) Colloidal Silica:

The polishing liquid of the present invention includes colloidal silica as at least a portion of the abrasive grains.

The colloidal silica preferably includes no impurity such as an alkali metal within the particulate, and is obtained by hydrolysis of alkoxy silane. On the other hand, colloidal silica manufactured by eliminating alkali from an alkali silicate aqueous solution may also be employed. However, in such cases, the alkali metal remaining within the particulate may gradually elute to adversely affect the polishing performance. From this perspective, the colloidal silica obtained by the hydrolysis of alkoxy silane is more preferable as the raw material.

The diameter of silica particles in the colloidal silica may be selected as appropriate according to the intended application of the abrasive grains, and is generally in a range of approximately 10 nm to 200 nm. However, from the perspective of preventing scratching, the primary average particle diameter is preferably in a range of 20 nm to 50 nm.

The addition amount of (C) colloidal silica in the polishing liquid (concentration) of the present invention with respect to the amount of polishing liquid when used in polishing is preferably no less than 0.5 mass % to no more than 15 mass %, more preferably no less than 3 mass % to no more than 12 mass %, and even more preferably no less than 5 mass % to no more than 12 mass %. Specifically, the amount of (C) colloidal silica being added is preferably no less than 0.5 mass % from the perspective of polishing the barrier layer at a sufficient polishing rate, and is preferably no more than 15 mass % from the perspective of storage stability.

In the polishing liquid of the present invention, as long as the effects of the present invention are not adversely affected in any way, additional abrasive grains other than the (C) colloidal silica may be used in combination. However, even in such cases, the amount of (C) colloidal silica with respect to the total amount of abrasive grains is preferably 50 mass % or more, and more preferably 80 mass % or more. Moreover, the abrasive grains may also be entirely comprised of (C) colloidal silica.

In the polishing liquid of the present invention, examples of the abrasive grains which can be combined with (C) colloidal silica may include fumed-silica, ceria, alumina, titania, and the like. Moreover, the size of abrasive grains to be combined is preferably equivalent to or greater than that of (C) colloidal silica, but is preferably no more than twice as large as that of (C) colloidal silica.

In the polishing liquid of the present invention, additive components may be optionally added to the abovementioned essential components (A) to (C), as needed. These additive components will be described hereinafter.

(D) Compound having a Carboxyl Group:

The polishing liquid of the present invention may preferably include (D) a compound having a carboxyl group (hereinafter, referred to as "organic acid" sometimes). Although the compound is not particularly limited in any way, as long as the compound has at least one carboxyl group in the molecule, the compound represented by the following formula (2) is preferably selected from the perspective of the polishing rate mechanism.

Moreover, there are preferably 1 to 4 carboxyl groups in the molecule, and more preferably 1 or 2 carboxyl groups in the molecule, from the perspective of cost efficiency.

$$R^7\text{—}O\text{—}R^8\text{—}COOH \qquad \text{Formula (2)}$$

In the abovementioned formula (2), $R^7$ and $R^8$ each individually represent a hydrocarbon group, preferably a hydrocarbon group having 1 to 10 carbon atoms.

$R^7$ is a monovalent hydrocarbon group, and preferably an alkyl group having 1 to 10 carbon atoms such as a methyl group, a cycloalkyl group and the like, an aryl group such as a phenyl group and the like, an alkoxy group, and an aryloxy group.

$R^8$ is a bivalent hydrocarbon group, and preferably an alkylene group having 1 to 10 carbon atoms such as a methylene group, a cycloalkylene group and the like, an arylene group such as a phenylene group and the like, and an alkyleneoxy group.

The hydrocarbon group represented by $R^7$ and $R^8$ may also have a substituent group. Examples of the substituent group which can be incorporated may include an alkyl group having 1 to 3 carbon atoms, an aryl group, an alkoxy group, a carboxyl group, and the like. In cases where the substituent group is a carboxyl group, the compound has plural carboxyl groups.

Moreover, $R^7$ and $R^8$ may be bound to each other to form a cyclic structure.

Examples of the compound represented by the abovementioned formula (2) may include, for example, 2-furancarboxylic acid, 2,5-furandicarboxylic acid, 3-furancarboxylic acid, 2-tetrahydrofurancarboxylic acid, diglycolic acid, methoxyacetic acid, methoxyphenylacetic acid, and phenoxyacetic acid. Out of these, 2,5-furandicarboxylic acid, 2-tetrahydrofurancarboxylic acid, diglycolic acid, and methoxyacetic acid are preferred from the perspective of polishing the surface to be polished at a high polishing rate.

The addition amount of (D) compound having a carboxyl group (preferably, the compound represented by the general formula (2)) with respect to the amount of the polishing liquid when used in polishing is preferably no less than 0.1 mass % to no more than 5 mass %, and more preferably no less than 0.5 mass % to no more than 2 mass %. Specifically, the amount of the compound having a carboxyl group (organic acid) is preferably no less than 0.1 mass % from the perspective of achieving a sufficient polishing rate, and is preferably no more than 5 mass % from the perspective of preventing excessive dishing.

(E) Surfactant:

The polishing liquid of the present invention includes a (E) surfactant.

By regulating the type or amount of the surfactant employed in the present invention, the polishing rate can be improved, and the polishing rate of the insulation layer can be controlled. As the surfactant, an anionic surfactant or a cationic surfactant is preferably employed.

Among these, a compound represented by the following formula (3) is preferable from the perspective of improving the polishing rate in polishing the insulation layer, while a compound represented by the following formula (4) is preferable from the perspective of suppressing the polishing rate in polishing the insulation layer.

$$R\text{—}SO_3^- \qquad \text{Formula (3)}$$

In the abovementioned formula (3), R represents a hydrocarbon group, preferably a hydrocarbon group having 6 to 20 carbon atoms.

Specifically, for example, an alkyl group and an aryl group having 6 to 20 carbon atoms such as a phenyl group, a naphthyl group and the like, is preferable. Moreover, this alkyl group or aryl group may further include a substituent group such as an alkyl group and the like.

Specific examples of the compound represented by formula (3) may include, for example, compounds such as decyl benzenesulfonic acid, dodecyl benzenesulfonic acid, tetradecyl benzenesulfonic acid, hexadecyl benzenesulfonic acid, dodecyl naphthalenesulfonic acid, tetradecyl naphthalenesulfonic acid, and the like.

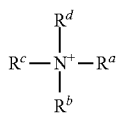

Formula (4)

In the abovementioned formula (4), $R^a$ to $R^d$ each individually represent a hydrocarbon group having 1 to 18 carbon atoms. However, the case where all of the $R^a$ to $R^d$ are the same hydrocarbon group is excluded from formula (4).

Examples of the hydrocarbon group represented by $R^a$ to $R^d$ may include an alkyl group, an aryl group, and a phenyl group. Out of these, an alkyl group having a straight or branched chain structure and having 1 to 20 carbon atoms is preferable.

Moreover, pair(s) of the groups $R^a$ to $R^d$ may be bound to each other to form a cyclic structure, such as a pyridine structure, a pyrrolidine structure, a piperidine structure, and a pyrrole structure.

Examples of the specific compound represented by formula (4) may include, for example, compounds such as lauryl trimethyl ammonium, lauryl triethyl ammonium, stearyl trimethyl ammonium, palmityl trimethyl ammonium, octyl trimethyl ammonium, dodecyl pyridinium, decyl pyridinium, and octyl pyridinium.

A compound other than those represented by the abovementioned formulae (3) and (4) may also be employed as the surfactant of the present invention. For example, a carboxylate, a sulfate salt, and a phosphate salt may also be used as the anionic surfactant, in addition to the compound represented by the abovementioned formula (3).

More specifically, preferable examples of the carboxylate include soap, an N-acrylamino acid salt, a polyoxyethylene or polyoxypropylene alkyl ether carboxylate, an acylated peptide, and the like; preferable examples of the sulfate salt include a sulfated oil, an alkyl sulfate, an alkyl ether sulfate, a polyoxyethylene or polyoxypropylene alkyl allyl ether sulfate, an alkyl amide sulfate, and the like; and preferable examples of the phosphate salt include an alkyl phosphate, a polyoxyethylene or polyoxypropylene alkyl allyl ether phosphate, and the like.

The total addition amount of (E) surfactant with respect to 1 liter of polishing liquid when used in polishing is preferably 0.001 g to 10 g, more preferably 0.01 g to 5 g, and even more preferably 0.01 g to 1 g. Specifically, the amount of the surfactant being added is preferably no less than 0.01 g from the perspective of achieving sufficient effects, and preferably no more than 1 g from the perspective of preventing a decrease in the CMP rate.

Other Components
Oxidizing Agent:

The polishing liquid of the present invention includes a compound capable of oxidizing the metal to be polished (oxidizing agent).

Examples of the oxidizing agent may include, for example, hydrogen peroxide, a peroxide, a nitrate, an iodate, a periodate, a hypochlorite, a chlorite, a chlorate, perchlorate, a persulfate, a dichromate, a permanganate, ozonated water, or silver (II) salt and iron (III) salt. Out of these, hydrogen peroxide is preferably employed.

As the iron (III) salt, an inorganic salt of iron (III) such as iron (III) nitrate, iron (III) chloride, iron (III) sulfate, and iron (III) bromide, and an organic complex salt of iron (III), may preferably be employed.

The amount of the oxidizing agent to be added can be regulated according to the amount of dishing at an early stage of barrier CMP. When the amount of dishing at an early stage of barrier CMP is large, i.e., the desired polishing amount of the wiring material in barrier CMP is not large, the addition amount of the oxidizing agent is preferably small. On the other hand, when the amount of dishing is substantially small and high-rate polishing of the wiring material is desired, the addition amount of the oxidizing agent is preferably large. As mentioned above, the amount of the oxidizing agent being added is preferably modified according to the dishing conditions at an early stage of barrier CMP, and is preferably 0.01 mol to 1 mol, and more preferably 0.05 mol to 0.6 mol, with respect to 1 liter of polishing solution when used in polishing.

pH Adjustor:

The polishing liquid of the present invention should have a pH in the range of 2.5 to 5.0, and more preferably a pH in the range of 3.0 to 4.5. By regulating the pH of the polishing liquid within this range, the polishing rate of the interlayer can be regulated more notably.

In order to regulate the pH within the abovementioned desired range, an alkali/acid or a buffering agent can be employed. The polishing liquid of the present invention achieves a superior effect when the pH is within the abovementioned range.

Examples of the alkali/acid or the buffering agent may preferably include ammonia; an organic ammonium hydroxide, such as ammonium hydroxide and tetramethyl ammonium hydroxide; a non-metallic alkali agent such as alkanol amines like, diethanol amine, triethanol amine, and triisopropanol amine; an alkali metal hydroxide such as, sodium hydroxide, potassium hydroxide, and lithium hydroxide; an inorganic acid, such as nitric acid, sulfuric acid, and phosphoric acid; a carbonate, such as sodium carbonate; a phosphate, such as trisodium phosphate; a borate; a tetraborate; a hydroxybenzoate; and the like. Among these, ammonium hydroxide, potassium hydroxide, lithium hydroxide, and tetramethyl ammonium hydroxide are particularly preferable.

The addition amount of the alkali/acid or the buffering agent may be determined to any amount that maintains the pH within the desired range, and is preferably 0.0001 mol to 1.0 mol, and more preferably 0.003 mol to 0.5 mol, with respect to 1 liter of the polishing liquid when used in polishing.

Chelating Agent:

The polishing liquid of the present invention may preferably include a chelating agent (i.e., a water softener), when necessary, in order to reduce adverse effects of a polyvalent metal ion incorporated therein, and the like.

Examples of the chelating agent may include a general-purpose water softener, or an analogous compound thereof, which is a calcium or magnesium precipitation inhibiting agent, for example, nitrilotriacetic acid; diethylene triamine penta-acetic acid; ethylene diamine tetra-acetic acid; nitrilo-N,N,N-trimethylene phosphonic acid; ethylene diamine-N,N,N',N'-tetramethylene sulfonic acid; trans-cyclohexanediamine tetraacetic acid; 1,2-diaminopropane tetraacetic acid; glycol ether diamine tetraacetic acid; ethylenediamine ortho hydroxylphenylacetic acid; ethylene diamine succinic acid (SS); N-(2-carboxylate ethyl)-L-asparagine acid; β-alanine diacetic acid; 2-phosphonobutane-1,2,4-tricarboxylic acid; 1-hydroxyethylidene-1,1-diphosphonic acid; N,N'-bis(2-hydroxybenzyl)ethylenediamine-N,N'-diacetic acid; and 1,2-dihydroxybenezene-4,6-disulfonic acid, and the like.

As necessary, two or more kinds of chelating agents may be used in combination. The amount of the chelating agent being added can be determined at any amount as long as it is sufficient to trap metal ions, such as polyvalent metal ions, and may be, for example, 0.0003 mol to 0.07 mol per 1 liter of the polishing liquid when used in polishing.

The polishing liquid of the present invention, typically, is suitable for polishing of a barrier layer composed of a barrier metal material for preventing copper diffusion, the barrier layer being placed between wiring lines composed of a copper metal and/or a copper alloy, and an interlayer insulation film.

Barrier Metal Material:

Typically, a low resistance metal material is preferable as the material constituting the barrier layer, which is the polishing object for the polishing liquid of the present invention, and preferable examples thereof include TiN, TiW, Ta, TaN, W and WN. Out of these, Ta and TaN are especially preferable.

Interlayer Insulation Film:

As the interlayer insulation film (insulation layer) which is polished with the polishing liquid of the present invention, in addition to conventionally employed interlayer insulation films such as TEOS, for example, an interlayer insulation film composed of a material having a specific inductive capacity of as low as about 3.5 to 2.0, such as those of an organic polymer type, an SiOC type, and SiOF type, which are conventionally referred to as Low-k films, may be exemplified.

Specific examples of the material used for formation of an interlayer insulation film having a low inductive capacity include, as those of SiOC type, HSG-R7 (trade name, manufactured by Hitachi Chemical Co., Ltd.), BLACK DIAMOND (trade name, manufactured by Applied Materials, Inc.), and the like.

The polishing liquid of the present invention may improve the polishing rate of the interlayer insulation film (insulation layer) by the combined use of diquaternary ammonium cation and colloidal silica.

Material for Wiring Lines:

The surface to be polished in the present invention preferably has wiring lines containing copper metal and/or a copper alloy, such as one applied to semi-conductor devices such as LSI chips. In particular, copper alloys are preferable as the raw material for such wiring lines. Moreover, among these, a copper alloy which includes silver is preferable.

Furthermore, the amount of silver included in the copper alloy is preferably no more than 40 mass %, more preferably no more than 10 mass %, even more preferably no more than 1 mass %, and the most superior effects can be achieved at an amount in the range of 0.00001 to 0.1 mass %.

Thickness of Wiring Lines:

When the object for polishing in the present invention is applied to DRAM type devices, the wiring lines preferably have a thickness of, in half-pitch, no more than 0.15 µm, more preferably no more than 0.10 µm, and even more preferably no more than 0.08 µm.

On the other hand, when the object for polishing is applied to MPU type devices, the wiring lines preferably have a thickness of no more than 0.12 µm, more preferably no more than 0.09 µm, and even more preferably no more than 0.07 µm.

The abovementioned polishing liquid of the present invention exhibits particularly superior effects to a surface having this type of wiring lines.

Polishing Method:

The polishing liquid of the present invention may be:

(1) in the form of a concentrated solution, which is diluted by adding water or an aqueous solution when employed;

(2) prepared by mixing aqueous solutions respectively containing the components of the polishing liquid, as mentioned below, and diluting by adding water when necessary; or (3) in the form of a liquid that can be used as is.

Any of the abovementioned polishing liquids (1) to (3) may be applied to the polishing method employing the polishing liquid of the present invention.

This polishing method is a method in which a polishing liquid is supplied onto a polishing pad placed on a polishing platen, the polishing pad is brought into contact with a surface to be polished, and the surface to be polished and polishing pad are set into relative motion.

A conventional polishing device having a holder for holding an object having a surface to be polished (for example, a wafer in which a film of conductive material is formed) and a polishing platen onto which a polishing pad is attached (equipped with a variable-speed motor and the like) may be used as the device employed in polishing.

As the polishing pad, conventional non-woven fabric, a polyurethane foam, a porous fluorocarbon resin, and the like, may be employed without being particularly limited. The rotation speed of the polishing platen is not particularly limited in any way, but is preferably as low as 200 rpm or less, so that the object to be polished does not deviate from the platen. Moreover, the contact pressure from the polishing pad to the object having the surface to be polished (a film to be polished) is preferably 0.68 to 34.5 kPa, and more preferably 3.40 to 20.7 kPa, in order to satisfy in-plane uniformity and pattern flatness of the substrate.

During polishing, the polishing liquid is continuously supplied onto the polishing pad by a pump and the like.

Once the substrate is completely polished, it is washed thoroughly with running water, and then dried by removing the water droplets on the polished substrate with a spin drier and the like.

When a concentrated liquid of the polishing liquid is diluted, as described in the abovementioned method (1), the aqueous solution indicated below can be employed for diluting the concentrated solution. The aqueous solution is water in which at least one component of an oxidizing agent, an organic acid, an additive agent, and a surfactant is preliminarily included, such that the total amount of the components in the aqueous solution and in the concentrated liquid is equal to that in the resulting polishing liquid when used in polishing (liquid for use).

Accordingly, when a process of preparing the polishing liquid by diluting a concentrated solution, components that do not readily dissolve can be compounded, subsequently, in the form of an aqueous solution. Consequently, a concentration liquid can be prepared to have an even higher degree of concentration.

Moreover, as the method of diluting the concentrated solution by adding water or an aqueous solution, a method may also be employed in which a pipe for supplying a concentrated polishing liquid and a pipe for supplying water or an aqueous solution are joined together in midstream, and thereby supplying a liquid for use of the polishing liquid that has been mixed and diluted onto the polishing pad. The mixing of the concentrated solution and the water or aqueous solution may be performed by a conventionally employed method, such as: a method in which liquids are collision-mixed by allowing the liquids to pass through a narrow path while applying pressure; a method in which a filler, such as glass pipes, is packed within the pipes, and branching/separation and convergence of the liquid streams are repeated; and a method in which a vane that is revolved by force is provided within the pipes.

The supplying rate of the polishing liquid is preferably 10 to 1000 ml/min, and more preferably 170 to 800 ml/min, in order to satisfy in-plane uniformity and pattern flatness of the surface to be polished.

Moreover, as the method of polishing while continuing to dilute the concentrated solution with water or an aqueous solution, there is a method in which the pipe supplying the polishing liquid and the pipe supplying water or the aqueous solution are separately provided, and predetermined amounts of the liquid and the water or aqueous solution is supplied onto the polishing pad from respective pipes, and polishing is carried out while mixing the liquid and the water or aqueous solution by means of the relative motion between the polishing pad and the surface to be polished. Furthermore, a polishing method may also be employed in which predetermined amounts of the concentrated liquid and the water or aqueous solution are mixed in a single container, and then the mixture is supplied onto the polishing pad.

Moreover, a polishing method may also be used in which the components which must be included in the polishing liquid are divided into at least two constituent components, and the constituent components are diluted, when employed, by adding water or an aqueous solution and supplied onto the polishing pad placed on the surface of the polishing platen, and then brought into contact with the surface to be polished, thereby performing polishing by relatively moving the surface to be polished and the polishing pad.

For example, the components may be divided in such a manner that an oxidizing agent is provided as the constituent component (A), while an organic acid, additive agent, surfactant and water are provided as the constituent component (B), and at the time of usage, the constituent components (A) and (B) are diluted with water or an aqueous solution.

Alternatively, the additive agents having low solubility may be separated to be included in either of the two constituent components (A) and (B), for example, in such a manner that the oxidizing agent, additive agent, and surfactant are provided as constituent component (A), while the organic acid, additive agent, surfactant, and water are provided as constituent component (B), and at the time of usage, the constituent components (A) and (B) are diluted with water or an aqueous solution.

In such cases as the abovementioned examples, three pipes are required in order to supply constituent component (A), constituent component (B), and water or an aqueous solution, respectively. The dilution and mixing may be carried out by a method in which the three pipes are joined to form a single pipe from which the polishing liquid is supplied onto the polishing pad, and mixing is performed within the pipe. In this case, it may also be possible that two of the pipes are joined first, and then the last pipe is joined, subsequently. This method is, specifically, that the constituent component containing the additive agent having low solubility and other constituent component(s) are mixed first, and after the mixture has passed through a long distance to ensure enough time for the additive agent to dissolve, water or an aqueous solution is supplied at the position where the last pipe is joined together.

Other mixing methods include a method in which three of the pipes are directly lead to the polishing pad, respectively, and mixing is carried out while the polishing pad and the surface to be polished are relatively moving; a method in which three constituent components are mixed in a single container, and the diluted polishing liquid is supplied onto the polishing pad; and the like.

In the abovementioned polishing methods, the temperature of the constituent components may be regulated such that the constituent component including an oxidizing agent has a temperature of no more than 40° C., while other constituent components are heated to a temperature ranging from room temperature to 100° C., and at the time of mixing those constituent components or adding water or an aqueous solution to dilute, the resulting solution has a temperature of no more than 40° C. This method is effective for elevating the solubility of the raw material having a low solubility in the polishing liquid, by utilizing a phenomenon that the solubility is elevated by increasing the temperature thereof.

The raw material that is dissolved by heating the other constituent components to a temperature ranging from room temperature to 100° C. precipitates in the solution as the temperature decreases. Therefore, when the other constituent component(s) are employed in a low temperature state, preheating of the precipitated components must be performed. The abovementioned heating can be achieved by applying a process in which the other constituent component(s) that have been heated to dissolve the raw material are delivered; or a process in which the liquid containing a precipitated material is agitated and delivered, while the pipe is heated to dissolve the material. If the heated other constituent component(s) increase the temperature of the constituent component(s) including the oxidizing agent up to 40° C. or more, the oxidizing agent may disintegrate. Therefore, the temperature of the mixture of the constituent component(s) including the oxidizing agent and the other constituent component(s) is preferably 40° C. or less.

As mentioned above, in the present invention, the components of the polishing liquid may be divided into at least two components, and supplied onto the surface to be polished. In such cases, it is preferable that the components are divided into a component containing the organic acid and a component including the oxide. Moreover, it may also be possible that the concentrated solution is provided as the polishing liquid, and the dilution water is separately supplied onto the surface to be polished.

In the present invention, in cases where a method in which the polishing liquid is divided into at least two groups of components and supplied onto the surface to be polished is applied, the supplying amount thereof refers to the sum of the amounts supplied from each pipe.

Pad:

As the polishing pad for polishing that can be employed in the polishing method of the present invention, either a non-foam structured pad or a foam structured pad may be applicable. The former employs a hard synthetic resin bulk material, such as a plastic plate, to form the pad. The latter further includes three types of the pad: an independent foam (dry foam type), a continuous foam (wet foam type), and a two-layer composite (laminated type). In particular, the two-layer foam composite is preferable. The foaming may be either uniform or non-uniform.

Furthermore, the pad may include abrasive grains which are conventionally employed in polishing (for example, those composed of ceria, silica, alumina, a resin, and the like). Moreover, the hardness of the pad may be either hard or soft. In the laminated type, it is preferable that each respective layer have a different hardness. Non-woven fabric, artificial leather, polyamide, polyurethane, polyester, polycarbonate and the like can be exemplified as the preferable materials. Moreover, lattice grooves, holes, concentric grooves, helical grooves, and the like may be formed on the surface of the pad to be in contact with the surface to be polished.

Wafer:

The diameter of the wafer as the object for polishing in a CMP process employing the polishing liquid of the present invention is preferably no less than 200 mm, and in particular, preferably no less than 300 mm. When the diameter is no less than 300 mm, effects of the present invention can be remarkably exhibited Polishing Device:

The device employing the polishing liquid of the present invention in a polishing process is not particularly limited in any manner, and may include a Mirra Mesa CMP, a Reflexion CMP (trade name, manufactured by Applied Materials, Inc.), a FREX 200 and a FREX 300 (trade name, manufactured by Ebara Corporation), an NPS 3301 and an NPS 2301 (trade name, manufactured by Nikon Corporation), an A-FP-310A and an A-FP-210A (trade name, manufactured by Tokyo Seimitsu, Co., Ltd.), a 2300 TERES (trade name, manufactured by Lam Research, Co., Ltd.), a Momentum (trade name, manufactured by SpeedFam-IPEC, Inc.), and the like.

The following are exemplary embodiments of the invention.

1. A polishing liquid for polishing a barrier layer of a semiconductor integrated circuit, the polishing liquid comprising:
   a diquaternary ammonium cation;
   a corrosion inhibiting agent; and
   a colloidal silica, wherein
   the pH of the polishing liquid is in the range of 2.5 to 5.0.
2. The polishing liquid according to 1, wherein the diquaternary ammonium cation is a cation introduced from a compound represented by Formula (1) below,

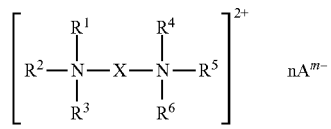

Formula (1)

wherein, in Formula (1): $R^1$ to $R^6$ each independently represent an alkyl group having 1 to 20 carbon atoms, an alkenyl group, a cycloalkyl group, an aryl group, or an aralkyl group, and pair(s) of the groups $R^1$ to $R^6$ may be bonded to each other; X represents an alkylene group having 1 to 10 carbon atoms, an alkenylene group, a cycloalkylene group, or an arylene group, or represents a combination of two or more groups thereof; and $nA^{m-}$ represents a counter anion, wherein n and m each independently represent an integer of 1 or 2, and wherein when n is 1, m is 2, and when n is 2, m is 1.

3. The polishing liquid according to 1, wherein the concentration of the colloidal silica is 0.5 mass % to 15 mass %, with respect to the total amount of the polishing liquid.
4. The polishing liquid according to 1, wherein the average primary particle size of the colloidal silica is in the range of 20 nm to 50 nm.
5. The polishing liquid according to claim 1, wherein the corrosion inhibiting agent is at least one compound selected from the group consisting of 1,2,3-benzotriazole, 5,6-methyl-1,2,3-benzotriazole, 1-(1,2-dicarboxyethyl) benzotriazole, 1-[N,N-bis(hydroxylethyl)aminomethyl] benzotriazole, and 1-(hydroxylmethyl)benzotriazole.
6. The polishing liquid according to 1, further comprising a compound containing a carboxyl group and being represented by Formula (2) below, $$R^7—O—R^8—COOH \quad \text{Formula (2)}$$

wherein, in Formula (2): $R^7$ and $R^8$ each independently represent a hydrocarbon group, and $R^7$ and $R^8$ may be bonded together to form a cyclic structure.

7. The polishing liquid according to 1, further comprising an anionic surfactant or a cationic surfactant.
8. The polishing liquid according to 1, further comprising an oxidizing agent.
9. The polishing liquid according to 1, further comprising a chelating agent.
10. The polishing liquid according to 2, wherein the amount of the compound represented by Formula (1) is 0.00001 mass % to 1 mass % with respect to the total amount of the polishing liquid.
11. The polishing liquid according to 2, wherein the counter anion represented by $nA^{m-}$ is selected from the group consisting of a nitrate ion, a citrate ion, a phosphate ion, an oxalate ion, a phthalate ion, a maleate ion, a fumarate ion, a tartrate ion, a malate ion, a glycolate ion, a hydroxide ion, an acetate ion, a trifluoroacetate ion, a lactate ion, a sulfate ion, a silicate ion, a p-toluenesulfonate ion, a benzenesulfonate ion, a methanesulfonate ion, a trifluoromethanesulfonate ion, an ethanesulfonate ion, a diglycolate ion, a 2,5-furandicarboxylate ion, a 2-tetrahydrofurancarboxylate ion, a borate ion, a tetrafluoroborate ion, and a hexafluorophosphate ion.

EXAMPLES

Hereinafter, the present invention will be explained in greater detail with reference to the following Examples. However, the present invention is not specifically limited to the Examples.

Example 1

A polishing liquid having a composition (composition (1), indicated below) was prepared and a polishing experiment was conducted. The pH of the obtained polishing liquid was adjusted to 3.5 with ammonia water and nitric acid.

Composition (1):
A) Diquaternary ammonium cation: hexamethonium chloride 0.2 g/l;
B) Corrosion inhibiting agent: benzotriazole 0.5 g/l;
C) Colloidal silica (secondary particle diameter: 65 nm, PL3 slurry, manufactured by Fuso Chemical, Co., Ltd.) 200 g/l;
D) Compound having a carboxyl group: diglycolic acid (manufactured by Wako Pure Chemical Industries, ltd.) 1 g/l;
Oxidizing agent: hydrogen peroxide 10 ml; and
Pure water was added to bring the total volume to 1000 ml.

Evaluation Method:

An LGP-612 (trade name, manufactured by Lapmaster SFT, Corporation) was employed as the polishing device, and each of the below-indicated wafer films were polished while providing a slurry under the following conditions:
Number of table revolutions: 90 rpm;
Number of head revolutions: 85 rpm;
Polishing pressure: 13.79 kPa;
Polishing pad: Polotepad (trade name, manufactured by Rodel Nitta Company); and
Polishing liquid supply rate: 200 ml/min <Polishing Rate Evaluation: Object for Polishing A>

An 8 inch wafer having a Ta film and a TEOS film formed on a Si substrate was employed as the object for polishing A.

<Scratch Evaluation: Object for Polishing B>

An 8 inch wafer employed as the object for polishing B has a configuration that grooves for wiring lines having a depth of 600 nm and a width of 0.09 μm to 100 μm and through holes are formed on a TEOS (tetraethoxysilane) substrate by patterning via a photolithography process and a reactive ion etching process; onto the TEOS substrate is formed a Ta film having a thickness of 20 nm by sputtering; onto the Ta film is formed a copper film having a thickness of 50 nm by sputtering; and finished with a copper film having a total thickness of 1000 nm formed by a plating method.

Polishing Rate Evaluation:

The polishing rate was determined by measuring the film thicknesses of the Ta film (barrier layer) and the TEOS film (insulation film) of the object for polishing A, at time points of before and after performing CMP, respectively, and calculating from the equation mentioned below. The results obtained are indicated in Table 1.

Polishing rate (nm/min)=(film thickness before polishing−film thickness after polishing)/(polishing time)

Scratch Evaluation:

After polishing the object for polishing B to reach the TEOS (polishing 50 nm of the TEOS film), the polished surface was cleaned with pure water and dried. The dried polished surface was then observed under a light microscope, and based on the evaluation criteria mentioned below the scratch evaluation was conducted. In the criteria, A and B represent levels in which scratchings was not problematic from a practical standpoint. The results obtained are indicated in Table 1.

Evaluation Criteria:

A: no problem scratch was observed;

B: 1 to 2 problem scratches were observed within the surface of the wafer; and

C: several problem scratches were observed within the surface of the wafer.

Examples 2 to 32 and Comparative Examples 1 to 3

The polishing experiments were conducted under the same conditions as those of Example 1, by employing a polishing liquid which was prepared by modifying the composition (1) of Example 1 into the compositions described in the below-mentioned Tables 1 to 3.

In Examples 2 to 32, salt compounds consisting of the abovementioned specific cations (A-2 to A-32) and a chloride ion were used in place of the hexamethonium chloride used in Example 1.

Examples 33 to 57

The polishing experiments were conducted under the same conditions as those of Example 1, by employing the polishing liquids containing the salt compounds shown in the below-mentioned Table 4 in place of the hexamethonium chloride used in Example 1, respectively. The results are shown in Table 4 together with the evaluation result of Example 1 for comparison.

Moreover, the polishing liquid prepared in Examples 33 to 57, evaluations of surface corrosion after polishing were also conducted according to the following process.

Specifically, after polishing the wafers of the same type as those used in the above scratch evaluation) to reach the TEOS (polishing 50 nm of the TEOS film), the polished surface was cleaned with pure water and dried. The copper wiring lines on the dried polished surface were then observed under a light microscope, and based on the evaluation criteria mentioned below the corrosion evaluation was conducted. The results are shown in Table 4.

Evaluation Criteria:

A: no problem corrosion was observed;

B: corrosions were partly observed within the surface of the wafer but were acceptable in practical use; and C: many problem corrosions were observed within the surface of the wafer.

TABLE 1

| | Polishing liquid | | | | | | Evaluation result | | |
| --- | --- | --- | --- | --- | --- | --- | --- | --- | --- |
| | (A) Specific cation (content) | (B) Anti-corrosion agent (content) | (C) Colloidal silica (content) | (D) Organic acid (content) | (E) Surfactant (content) | pH | Ta polishing rate (nm/min) | TEOS polishing rate (nm/min) | Post-polishing scratch performance |
| Example 1 | A-1 (0.2 g/L) | BTA (1.0 g/L) | C-1 (5.0 mass %) | D-1 (1.0 g/L) | — | 3.5 | 44 | 81 | A |
| Example 2 | A-2 (0.2 g/L) | BTA (1.0 g/L) | C-1 (2.5 mass %) C-3 (2.5 mass %) | D-1 (1.0 g/L) | DP (0.5 g/L) | 3.2 | 48 | 107 | A |
| Example 3 | A-3 (0.2 g/L) | DBTA (1.0 g/L) | C-2 (5.0 mass %) | D-2 (1.0 g/L) | — | 3.5 | 46 | 78 | A |
| Example 4 | A-4 (0.2 g/L) | DCEBTA (1.0 g/L) | C-3 (5.0 mass %) | D-1 (1.0 g/L) | DP (0.5 g/L) | 3.5 | 50 | 98 | A |
| Example 5 | A-5 (0.2 g/L) | BTA (1.0 g/L) | C-1 (2.5 mass %) C-3 (2.5 mass %) | D-3 (1.0 g/L) | DBS (0.5 g/L) | 3.5 | 46 | 70 | A |
| Example 6 | A-6 (0.2 g/L) | HMBTA (1.0 g/L) | C-4 (5.0 mass %) | D-1 (1.0 g/L) | — | 3.5 | 45 | 83 | A |
| Example 7 | A-7 (2 g/L) | BTA (1.0 g/L) | C-4 (2.5 mass %) C-5 (2.5 mass %) | D-1 (1.0 g/L) | LTM (0.5 g/L) | 3.5 | 55 | 90 | A |
| Example 8 | A-8 (0.2 g/L) | BTA (1.0 g/L) | C-2 (5.0 mass %) | D-1 (1.0 g/L) | — | 3.5 | 52 | 78 | A |
| Example 9 | A-9 (0.2 g/L) | HEABTA (1.0 g/L) | C-4 (5.0 mass %) | D-3 (1.0 g/L) | DP (0.5 g/L) | 3.5 | 46 | 112 | A |
| Example 10 | A-10 (0.2 g/L) | BTA (1.0 g/L) | C-2 (2.5 mass %) C-3 (2.5 mass %) | D-3 (1.0 g/L) | DBS (0.5 g/L) | 3.8 | 45 | 71 | A |

TABLE 2

| | Polishing liquid | | | | | | Evaluation result | | |
|---|---|---|---|---|---|---|---|---|---|
| | (A) Specific cation (content) | (B) Anti-corrosion agent (content) | (C) Colloidal silica (content) | (D) Organic acid (content) | (E) Surfactant (content) | pH | Ta polishing rate (nm/min) | TEOS polishing rate (nm/min) | Post-polishing scratch performance |
| Example 11 | A-11 (0.2 g/L) | BTA (1.0 g/L) | C-2 (5.0 mass %) | D-4 (1.0 g/L) | DP (0.5 g/L) | 3.5 | 46 | 90 | A |
| Example 12 | A-12 (0.2 g/L) | BTA (1.0 g/L) | C-1 (5.0 mass %) | D-1 (1.0 g/L) | — | 3.5 | 43 | 85 | A |
| Example 13 | A-13 (0.2 g/L) | HMBTA (1.0 g/L) | C-2 (5.0 mass %) | D-1 (1.0 g/L) | — | 3.5 | 45 | 80 | A |
| Example 14 | A-14 (0.2 g/L) | DBTA (1.0 g/L) | C-1 (5.0 mass %) | — | DNS (0.5 g/L) | 3.5 | 50 | 75 | A |
| Example 15 | A-15 (0.2 g/L) | DCEBTA (1.0 g/L) | C-1 (5.0 mass %) | D-1 (1.0 g/L) | — | 3.5 | 50 | 78 | A |
| Example 16 | A-16 (0.2 g/L) | BTA (1.0 g/L) | C-1 (5.0 mass %) | D-1 (1.0 g/L) | — | 3.5 | 48 | 80 | A |
| Example 17 | A-17 (0.2 g/L) | BTA (1.0 g/L) | C-3 (5.0 mass %) | D-1 (1.0 g/L) | — | 3.5 | 44 | 76 | A |
| Example 18 | A-18 (0.2 g/L) | DBTA (1.0 g/L) | C-1 (5.0 mass %) | D-1 (1.0 g/L) | — | 3.5 | 47 | 72 | A |
| Example 19 | A-19 (0.2 g/L) | DCEBTA (1.0 g/L) | C-2 (5.0 mass %) | D-1 (1.0 g/L) | DBS (0.5 g/L) | 3.5 | 44 | 68 | A |
| Example 20 | A-20 (0.2 g/L) | BTA (1.0 g/L) | C-1 (5.0 mass %) | D-4 (1.0 g/L) | — | 3.2 | 46 | 70 | A |
| Example 21 | A-21 (0.2 g/L) | BTA (1.0 g/L) | C-1 (2.5 mass %) C-3 (2.5 mass %) | D-1 (1.0 g/L) | DP (0.5 g/L) | 3.5 | 48 | 92 | A |
| Example 22 | A-22 (0.2 g/L) | BTA (1.0 g/L) | C-1 (5.0 mass %) | D-2 (1.0 g/L) | LTM (0.5 g/L) | 3.5 | 52 | 95 | A |
| Example 23 | A-23 (0.2 g/L) | BTA (1.0 g/L) | C-1 (5.0 mass %) | D-1 (1.0 g/L) | DP (0.5 g/L) | 3.5 | 54 | 108 | A |

TABLE 3

| | Polishing liquid | | | | | | Evaluation result | | |
|---|---|---|---|---|---|---|---|---|---|
| | (A) Specific cation (content) | (B) Anti-corrosion agent (content) | (C) Colloidal silica (content) | (D) Organic acid (content) | (E) Surfactant (content) | pH | Ta polishing rate (nm/min) | TEOS polishing rate (nm/min) | Post-polishing scratch performance |
| Example 24 | A-24 (0.2 g/L) | BTA (1.0 g/L) | C-1 (5.0 mass %) | D-2 (1.0 g/L) | — | 3.5 | 52 | 75 | A |
| Example 25 | A-25 (0.2 g/L) | DCEBTA (1.0 g/L) | C-3 (5.0 mass %) | D-1 (1.0 g/L) | — | 3.5 | 50 | 82 | A |
| Example 26 | A-26 (0.2 g/L) | BTA (1.0 g/L) | C-2 (5.0 mass %) | D-1 (1.0 g/L) | DP (0.5 g/L) | 3.8 | 48 | 76 | A |
| Example 27 | A-27 (0.2 g/L) | HEABTA (1.0 g/L) | C-4 (5.0 mass %) | D-1 (1.0 g/L) | DP (0.5 g/L) | 3.5 | 46 | 97 | A |
| Example 28 | A-28 (0.2 g/L) | BTA (1.0 g/L) | C-1 (5.0 mass %) | D-4 (1.0 g/L) | — | 3.5 | 44 | 85 | A |
| Example 29 | A-29 (0.2 g/L) | BTA (1.0 g/L) | C-1 (5.0 mass %) | D-1 (1.0 g/L) | — | 3.5 | 45 | 74 | A |
| Example 30 | A-30 (0.2 g/L) | BTA (1.0 g/L) | C-2 (5.0 mass %) | D-2 (1.0 g/L) | — | 3.5 | 46 | 73 | A |
| Example 31 | A-31 (0.2 g/L) | BTA (1.0 g/L) | C-4 (5.0 mass %) | D-1 (1.0 g/L) | — | 3.5 | 48 | 75 | A |
| Example 32 | A-32 (0.2 g/L) | BTA (1.0 g/L) | C-1 (2.5 mass %) C-3 (2.5 mass %) | — | DP (0.5 g/L) | 3.5 | 43 | 90 | A |
| Comp. Example 1 | — | BTA (1.0 g/L) | C-1 (5.0 mass %) | glycine (1.0 g/L) | — | 3.5 | 25 | 45 | B |
| Comp. Example 2 | — | BTA (1.0 g/L) | C-2 (2.5 mass %) C-3 (2.5 mass %) | glycine (1.0 g/L) | — | 8.5 | 10 | 20 | C |
| Comp. Example 3 | — | BTA (1.0 g/L) | C-1 (5.0 mass %) | imino diacetic acid (1.0 g/L) | — | 5.5 | 30 | 35 | C |

TABLE 4

| | Polishing liquid | | Evaluation result | | | |
|---|---|---|---|---|---|---|
| | (A) Specific cation (content) | Counter anion | Ta polishing rate (nm/min) | TEOS polishing rate (nm/min) | Scratch | Corrosion |
| Example 1 | A-1 (0.2 g/L) | Chloride ion | 44 | 81 | A | B |
| Example 33 | A-1 (0.2 g/L) | Nitrate ion | 42 | 81 | A | A |

TABLE 4-continued

| | Polishing liquid | | Evaluation result | | | |
|---|---|---|---|---|---|---|
| | | | Ta polishing rate | TEOS polishing rate | Post-polishing scratch performance | |
| | (A) Specific cation (content) | Counter anion | (nm/min) | (nm/min) | Scratch | Corrosion |
| Example 34 | A-1 (0.2 g/L) | Citrate ion | 44 | 81 | A | A |
| Example 35 | A-1 (0.2 g/L) | Phosphate ion | 44 | 80 | A | A |
| Example 36 | A-1 (0.2 g/L) | Oxalate ion | 44 | 81 | A | A |
| Example 37 | A-1 (0.2 g/L) | Phthalate ion | 44 | 81 | A | A |
| Example 38 | A-1 (0.2 g/L) | Maleate ion | 45 | 81 | A | A |
| Example 39 | A-1 (0.2 g/L) | Fumarate ion | 44 | 81 | A | A |
| Example 40 | A-1 (0.2 g/L) | Tartrate ion | 44 | 85 | A | A |
| Example 41 | A-1 (0.2 g/L) | Malate ion | 44 | 81 | A | A |
| Example 42 | A-1 (0.2 g/L) | Glycolate ion | 44 | 81 | A | A |
| Example 43 | A-1 (0.2 g/L) | Hydroxide ion | 44 | 81 | A | A |
| Example 44 | A-1 (0.2 g/L) | Acetate ion | 44 | 80 | A | A |
| Example 45 | A-1 (0.2 g/L) | Trifluoroacetate ion | 43 | 81 | A | A |
| Example 46 | A-1 (0.2 g/L) | Lactate ion | 44 | 81 | A | A |
| Example 47 | A-1 (0.2 g/L) | Sulfate ion | 42 | 81 | A | A |
| Example 48 | A-1 (0.2 g/L) | Silicate ion | 44 | 83 | A | A |
| Example 49 | A-1 (0.2 g/L) | p-toluenesulfonate ion | 44 | 81 | A | A |
| Example 50 | A-1 (0.2 g/L) | Benzenesulfonate ion | 44 | 81 | A | A |
| Example 51 | A-1 (0.2 g/L) | Methanesulfonate ion | 44 | 81 | A | A |
| Example 52 | A-1 (0.2 g/L) | Trifluoromethane sulfonate ion | 44 | 81 | A | A |
| Example 53 | A-1 (0.2 g/L) | Ethanesulfonate ion | 44 | 81 | A | A |
| Example 54 | A-1 (0.2 g/L) | Diglycolate ion | 42 | 81 | A | A |
| Example 55 | A-1 (0.2 g/L) | Borate ion | 44 | 82 | A | A |
| Example 56 | A-1 (0.2 g/L) | Tetrafluoroborate ion | 44 | 81 | A | A |
| Example 57 | A-1 (0.2 g/L) | Hexafluoro phosphate ion | 44 | 81 | A | A |

The (A) diquaternary ammonium cations (specific cations) A-1 to A-32 described in abovementioned Tables 1 to 4 refer to the abovementioned example cations.

The names of the compounds abbreviated in the abovementioned Tables 1 to 3 are indicated below.

(B) Anti-Corrosion Agent

BTA: 1,2,3-benzotriazole;

DBTA: 5,6-dimethyl-1,2,3-benzotriazole;

DCEBTA: 1-(1,2-dicarboxyethyl)benzotriazole;

HEABTA: 1-[N,N-bis(hydroxyethyl)aminomethyl]benzotriazole; and

HMBTA: 1-(hydroxymethyl)benzotriazole;

(E) Surfactant

DBS: dodecylbenzenesulfonic acid;

DNS: dodecylnaphthalenesulfonic acid;

LTM: lauryltrimethylammonium nitrate; and

DP: dodecylpyridinium nitrate

The shapes and the primary average particle diameters of (C) colloidal silica C-1 to C-5 described in the abovementioned Tables 1 to 3 are as indicated in the following. The colloidal silica products C-1 to C-5 described below are all manufactured by Fuso Chemical, Co., Ltd. The names of colloidal silica C-1 to C-5 (primary average particle diameter (nm), shape) are indicated below.

C-1: PL3 (35 nm, cocoon-shaped)

C-2: PL3L (35 nm, spherical)

C-3: PL3H (35 nm, aggregate)

C-4: PL2 (25 nm, cocoon-shaped)

C-5: PL2L (20 nm, spherical)

The following are the names of (D) compounds containing a carboxyl group D-1 to D-4 (organic acids) described in the abovementioned Tables 1 to 3. The names of the compounds containing a carboxyl group D-1 to D-4 are indicated below.

D-1: diglycolic acid

D-2: 2,5-furandicarboxylic acid

D-3: 2-tetrahydroxyfurancarboxylic acid

D-4: methoxyacetic acid

According to the abovementioned Tables 1 to 4, in cases where the polishing liquid employed in Examples 1 to 57, as compared with Comparative Examples 1 to 3, the polishing rates of Ta and TEOS films are higher, and the scratch performance is also superior. Moreover, in cases where (E) surfactant is added, the polishing rates are also high while the scratch performances are not impaired.

On the other hand, although the polishing liquid of Comparative Example 1 presents no problems with regard to scratch performance, the polishing rates of Ta and TEOS films are inferior. In addition, the polishing liquid of Comparative Examples 2 and 3 demonstrate low polishing rates of Ta and TEOS films, and there are problems in scratch performance, as well.

Moreover, according to Table 4, it is found that corrosion after polishing can be further suppressed by using the counter ions described in Examples 33 to 57 as the counter anion of the specific cation (A).

Considering the above, it is understood that the polishing liquid of the present invention provides superior polishing rates of Ta and TEOS films, as well as superior scratch performance.

All publications, patent applications, and technical standards mentioned in this specification are herein incorporated by reference to the same extent as if each individual publication, patent application, or technical standard was specifically and individually indicated to be incorporated by reference.

What is claimed is:

1. A polishing liquid for polishing a barrier layer of a semiconductor integrated circuit, the polishing liquid comprising:

a diquaternary ammonium cation;
a corrosion inhibiting agent which is benzotriazole or a derivative thereof; and
a colloidal silica, wherein the pH of the polishing liquid is in the range of 2.5 to 5.0,
wherein the diquaternary ammonium cation is a cation introduced from a compound represented by Formula (1) below,

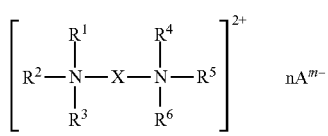

Formula (1)

wherein, in Formula (1): $R^1$ to $R^6$ each independently represent an alkyl group having 1 or 2 carbon atoms; X represents an alkylene group having 5 or 6 carbon atoms; and $nA^{m-}$ represents a counter anion, wherein n and m each independently represent an integer of 1 or 2, and wherein when n is 1, m is 2, and when n is 2, m is 1,
wherein the counter anion represented by $nA^{m-}$ is selected from the group consisting of a nitrate ion, a citrate ion, a phosphate ion, an oxalate ion, a phthalate ion, a maleate ion, a fumarate ion, a tartrate ion, a malate ion, a glycolate ion, a hydroxide ion, an acetate ion, a lactate ion, a sulfate ion, a silicate ion, a p-toluenesulfonate ion, a benzenesulfonate ion, a methanesulfonate ion, an ethanesulfonate ion, a diglycolate ion, a 2,5-furandicarboxylate ion, a 2-tetrahydrofurancarboxylate ion, a chloride ion, and a borate ion,
wherein the cation is (A-2) or (A-9):

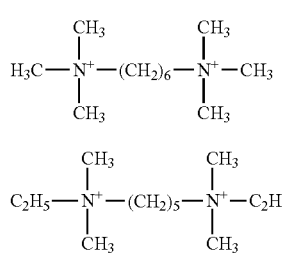

and
wherein the amount of the compound represented by Formula (1) is 0.0001 mass % to 1 mass % with respect to the total amount of the polishing liquid.

2. The polishing liquid according to claim 1, wherein the concentration of the colloidal silica is 0.5 mass % to 15 mass %, with respect to the total amount of the polishing liquid.

3. The polishing liquid according to claim 1, wherein the average primary particle size of the colloidal silica is in the range of 20 nm to 50 nm.

4. The polishing liquid according to claim 1, wherein the corrosion inhibiting agent is at least one compound selected from the group consisting of 1,2,3-benzotriazole, 5,6-methyl-1,2,3-benzotriazole, 1-(1,2-dicarboxyethyl)benzotriazole, 1-[N,N-bis(hydroxylethyl)aminomethyl]benzotriazole, and 1-(hydroxylmethyl)benzotriazole.

5. The polishing liquid according to claim 1, further comprising a compound containing a carboxyl group and being represented by Formula (2) below,

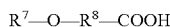

$R^7$—O—$R^8$—COOH    Formula (2)

wherein, in Formula (2): $R^7$ and $R^8$ each independently represent a hydrocarbon group, and $R^7$ and $R^8$ may be bonded together to form a cyclic structure.

6. The polishing liquid according to claim 1, further comprising an anionic surfactant or a cationic surfactant.

7. The polishing liquid according to claim 1, further comprising an oxidizing agent.

8. The polishing liquid according to claim 1, further comprising a chelating agent.

9. The polishing liquid according to claim 1, wherein the counter anion is selected from the group consisting of a nitrate ion, a citrate ion, a phosphate ion, an oxalate ion, a phthalate ion, a maleate ion, a fumarate ion, a tartrate ion, a malate ion, a glycolate ion, an acetate ion, a lactate ion, a sulfate ion, a silicate ion, a p-toluenesulfonate ion, a benzenesulfonate ion, a methanesulfonate ion, an ethanesulfonate ion, a diglycolate ion, a 2,5-furandicarboxylate ion, a 2-tetrahydrofurancarboxylate ion, a chloride ion, and a borate ion.

10. The polishing liquid according to claim 1, wherein the counter anion is selected from the group consisting of a nitrate ion, a citrate ion, a phosphate ion, an oxalate ion, a phthalate ion, a maleate ion, a fumarate ion, a tartrate ion, a malate ion, a glycolate ion, a hydroxide ion, an acetate ion, a lactate ion, a sulfate ion, a silicate ion, a p-toluenesulfonate ion, a benzenesulfonate ion, a methanesulfonate ion, an ethanesulfonate ion, a diglycolate ion, a chloride ion, and a borate ion.

11. The polishing liquid according to claim 1, wherein the pH of the polishing liquid is in the range of 3.0-4.5.

12. The polishing liquid according to claim 1, wherein the amount of the compound represented by Formula (1) is 0.0001 mass % to 0.5 mass % with respect to the total amount of the polishing liquid.

13. The polishing liquid according to claim 1, wherein the amount of the corrosion inhibiting agent is 0.01 mass % to 0.2 mass % with respect to the total amount of the polishing liquid.

14. The polishing liquid according to claim 1, wherein the amount of the colloidal silica is 3 mass % to 12 mass % with respect to the total amount of the polishing liquid.

15. The polishing liquid according to claim 1, wherein the amount of the corrosion inhibiting agent is 0.01 mass % to 0.2 mass % with respect to the total amount of the polishing liquid and the amount of the colloidal silica is 3 mass % to 12 mass % with respect to the total amount of the polishing liquid.

16. The polishing liquid according to claim 1, wherein the cation is (A-2).

17. The polishing liquid according to claim 1, wherein the cation is (A-9).

18. The polishing liquid according to claim 15, wherein the cation is (A-2).

19. The polishing liquid according to claim 15, wherein the cation is (A-9).

* * * * *